United States Patent
Barrenscheen et al.

(10) Patent No.: US 11,626,826 B1
(45) Date of Patent: Apr. 11, 2023

(54) SCHEDULING COMMUTATION BEHAVIOR CHANGES FOR A DRIVER

(71) Applicant: Infineon Technologies AG, Neubiberg (DE)

(72) Inventors: Jens Barrenscheen, Munich (DE); Michael Krug, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/509,428

(22) Filed: Oct. 25, 2021

(51) Int. Cl.
*H02P 27/06* (2006.01)
*H03K 17/687* (2006.01)

(52) U.S. Cl.
CPC ......... *H02P 27/06* (2013.01); *H03K 17/6872* (2013.01); *H03K 17/6874* (2013.01)

(58) Field of Classification Search
CPC . H02P 27/06; H03K 17/6872; H03K 17/6874
See application file for complete search history.

(56) References Cited

U.S. PATENT DOCUMENTS 4,884,165 A * 11/1989 Kong ............... H03K 17/08142
327/108

* cited by examiner

*Primary Examiner* — Jung Kim
(74) *Attorney, Agent, or Firm* — Shumaker & Sieffert, P.A.

(57) ABSTRACT

A driver may comprise a first node, a second node, and processing circuitry. The first node is configured to receive a command from controller circuitry. The second node is configured to receive a commutation signal for activating or deactivating a switch. The processing circuitry is configured to determine, based on the received command, an activation setting for an activation characteristic for the switch and a deactivation setting for a deactivation characteristic for the switch and drive the switch based on the commutation signal. To drive the switch, the processing circuitry is configured to change, at a first time, the deactivation characteristic for the switch from a previous deactivation setting to the determined deactivation setting and change, at a second time that is different from the first time, the activation characteristic for the switch from a previous activation setting to the determined activation setting.

9 Claims, 11 Drawing Sheets

SCHEDULING COMMUTATION BEHAVIOR CHANGES FOR A DRIVER

TECHNICAL FIELD

This disclosure relates to power electronics, and more specifically to power converter systems and devices that operate in power converter systems.

BACKGROUND

In many systems, power converters are used to control voltage and/or current levels within the system. Power converters may comprise buck converters, boost converters, buck/boost converters, or other types. Some converters, for example, may comprise an LC circuit or a connection to a phase terminal of an electric drive that is connected to a switch node, where the switch node is positioned between a high-side power switch and a low-side power switch. The high-side and low-side power switches are controlled by driver circuits via modulation or commutation control signals, such as pulse width modulation (PWM) signals, pulse frequency modulation (PFM) signals, pulse duration modulation signals, pulse density modulation signals, or another type of modulation or commutation control signal.

In particular, a controller or a gate driver can deliver modulation or commutation control signals to the gates of the high-side and low-side power switches to control the on/off switching of the power switches. In some examples, logic in the controller delivers control signals to the driver(s), and the driver(s) generate and deliver higher-power driving signals to the control terminals of the power switches. By controlling the on/off switching of the power switches, the controller can effectively control the delivery of power to the switch node that is located between the high-side switch and the low-side switch that form a half bridge. In this way, by controlling the high-side and low-side switches of a power converter, the controller can cause a desired level of current and voltage to be output from the power converter in order to provide power to a load or another component of the system.

SUMMARY

In general, this disclosure is directed to techniques for driving a switch based on a commutation signal, which may help to avoid a short circuit condition. For example, techniques described herein may include a delay mechanism to switch between a slower commutation and a faster commutation to help ensure that a delay mismatch in reception of the request in gate driver devices (e.g., of a same half-bridge) does not lead to a short circuit. A delay mismatch may occur if the gate drivers are located in a certain distance from the controller device or in case of noise effects on the signals between the controller device and the gate drivers.

An activation or deactivation characteristic may comprise an initial delay, a value or a sequence of values of voltages or currents or slew rates for voltages or currents applied by the gate driver during the transition from deactivated state to activated state of a switch (activation characteristic) or from activated state to deactivated state (deactivation characteristic). Activated state of a switch refers to a conducting switch and deactivated state refers to a non-conducting switch. The values of an activation characteristic are defined by an activation setting. The values of a deactivation characteristic are defined by a deactivation setting.

For example, a driver may be configured to change, at a first time, an applied deactivation characteristic for a switch from a previous deactivation setting to a determined deactivation setting and change, at a second time that is different from the first time, an applied activation characteristic for the switch from a previous activation setting to the determined activation setting. In this way, the system may help to apply fast switching-off as soon as possible and apply fast switching-on only if fast switching-off is ensured (e.g., by introducing a delay) and may help to apply slow switching-on as soon as possible and apply slow switching-off only if slow switching-on is ensured, e.g. by introducing a delay.

In one example, a driver comprising a first node, a second node, and processing circuitry. The first node is configured to receive a command from controller circuitry. The second node is configured to receive a commutation signal for activating or deactivating a switch. The processing circuitry is configured to determine, based on the received command, an activation setting for an activation characteristic for the switch and a deactivation setting for a deactivation characteristic for the switch and drive the switch based on the commutation signal. To drive the switch, the processing circuitry is configured to change, at a first time, the deactivation characteristic for the switch from a previous deactivation setting to the determined deactivation setting and change, at a second time that is different from the first time, the activation characteristic for the switch from a previous activation setting to the determined activation setting.

In another example, this disclosure describes a system comprising controller circuitry configured to output a command and commutation circuitry configured to generate a first commutation signal and a second commutation signal. The system further comprises a first driver configured to activate a first switch based on the first commutation signal and a first activation characteristic for the first switch and to deactivate the first switch based on the first commutation signal and a first deactivation characteristic for the first switch. The first driver is configured to change, at a first time after the command, the first activation characteristic for the first switch from a first previous activation setting to a first following activation setting. The system further includes a second driver configured to activate a second switch based on the second commutation signal and a second activation characteristic for the second switch and to deactivate the second switch based on the second commutation signal and a second deactivation characteristic for the second switch. The second driver is configured to change, at a second time after the command that is different to the first time, the second deactivation characteristic from a first previous deactivation setting to a second following deactivation setting.

In one example, this disclosure describes a system comprising controller circuitry configured to generate a first command and a second command and commutation circuitry configured to generate a first set of commutation signals and a second set of commutation signals. The system further comprises first phase circuitry comprising a first driver and a second driver configured to drive a first switch and a second switch based on the first set of commutation signals and the first command and second phase circuitry comprising a third driver and a fourth driver configured to drive a third switch and a fourth switch based on a the second set of commutation signals and the second command.

In another example, this disclosure describes a method for operating a driver. The method includes receiving, by processing circuitry, a command from controller circuitry and determining, by the processing circuitry, based on the received command, an activation setting for an activation characteristic for the switch and a deactivation setting for a deactivation characteristic for the switch. The method further includes changing, by the processing circuitry, at a first time after the command, the deactivation characteristic for the switch from a previous deactivation setting to the determined deactivation setting and changing, by the processing circuitry, at a second time after the command that is different to the first time, the activation characteristic for the switch from a previous activation setting to the determined activation setting.

Details of these and other examples are set forth in the accompanying drawings and the description below. Other features, objects, and advantages will be apparent from the description and drawings, and from the claims.

DETAILED DESCRIPTION

In general, this disclosure is directed to techniques for driving a switch based on a commutation signal, which may help to avoid a short circuit condition. For example, techniques described herein may include a delay mechanism to switch between a slower commutation and a faster commutation to help ensure that a delay mismatch in reception of the request in gate driver devices (e.g., of a same half-bridge) does not lead to a short circuit. While examples described herein may refer to a motor (e.g., a 3-phase motor or a 6-phase motor) as a load, other examples may apply to other loads.

For example, a driver may be configured to change, at a first time, a deactivation characteristic for a switch from a previous deactivation setting to a determined deactivation setting and change, at a second time that is different from the first time, an activation characteristic for the switch from a previous activation setting to the determined activation setting. For instance, the driver may delay an application of fast activation setting request until a defined number of pulse width modulation (PWM) edges for switching on has been detected. In some instances, the driver may delay application of slow deactivation setting request until a defined number of PWM edges for switching off has been detected. The number of the respective PWM edges may be configurable.

In this way, a system may help to apply fast switching-off as soon as possible and apply fast switching-on only if fast switching-off is ensured (e.g., by introducing a delay) and help to apply slow switching-on as soon as possible and apply slow switching-off only if slow switching-on is ensured, e.g. by introducing a delay. Switching-off and switching-on as soon as possible may help to minimize dead-time, which may help to reduce a switching loss of the system. Moreover, techniques described herein may help to ensure that a short circuit does not occur, which may help to prevent damage to the system and may improve a safety of the system.

Figure 1:
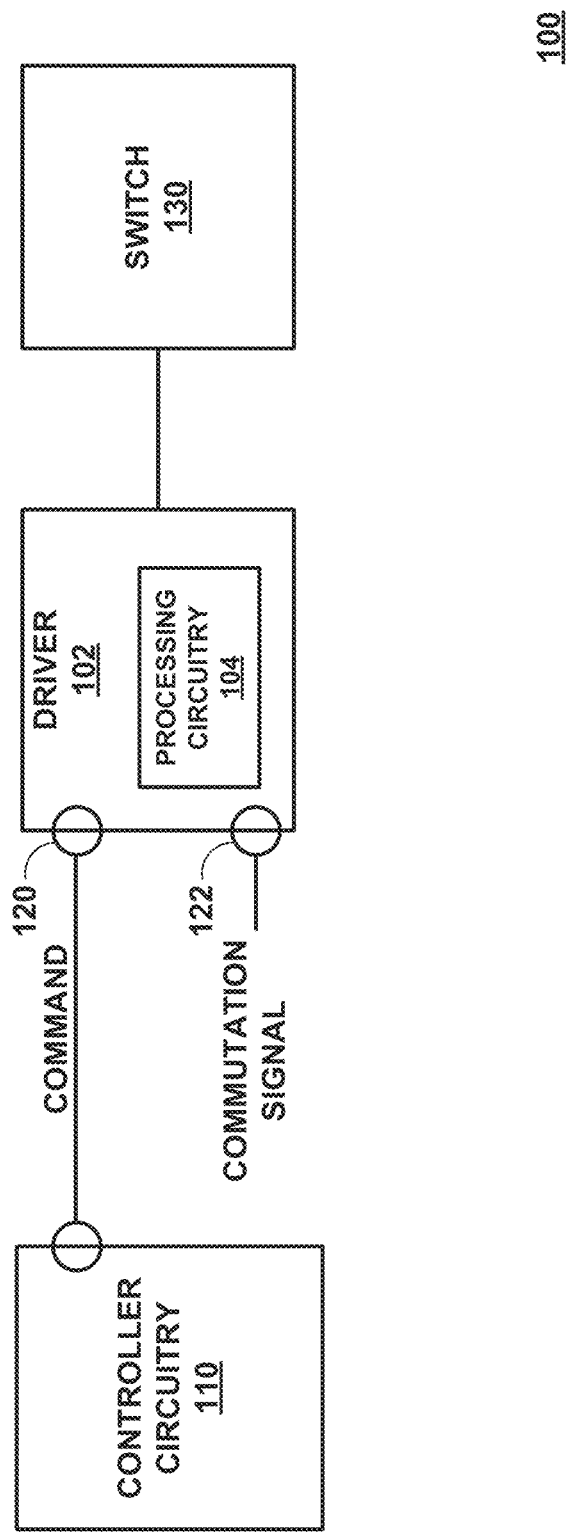
FIG. 1 is a block diagram illustrating an example system configured to change an activation setting and a deactivation setting of a switch at different times, in accordance with one or more techniques of this disclosure.

FIG. 1 is a block diagram illustrating an example system 100 configured to change an activation setting and a deactivation setting of a switch 130 at different times, in accordance with one or more techniques of this disclosure. In the example of FIG. 1, controller circuitry 110 is arranged on a first integrated circuit and driver 102 is arranged on a second integrated circuit that is different from the second integrated circuit. However, in some examples, controller circuitry 110 and driver 102 may be arranged in a single integrated circuit.

Controller circuitry 110 may be configured to output a command. For example, controller circuitry 110 may generate the command to indicate when to apply slow switching and when to apply fast switching. Controller circuitry 110 may include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Driver 102 may include processing circuitry 104, first node 120, and second node 122. First node 120 may be configured to receive the command from controller circuitry 110. Second node 122 may be configured to receive a commutation signal for activating or deactivating switch 130. For example, controller circuitry 110 may output the commutation signal. In some examples, other circuitry may output the commutation signal.

Processing circuitry 104 may be configured to drive switch 103 based on the commutation signal. For example, processing circuitry 104 may be configured to drive switch 103 based on an edge of the commutation signal. Processing circuitry 104 may include one or more processors, such as one or more microprocessors, DSPs, ASICs, FPGAs, or any other equivalent integrated or discrete logic circuitry, as well as any combinations of such components.

Switch 130 may be configured to activate (e.g., switch-on=switch to conductive mode) and deactivate (e.g., switch-off=switch to non-conducting mode). For example, driver 102 may drive switch 130 to switch-on or switch-off using a control node or a gate. Switch 130 may represent a switching element. Examples of switching elements may include, but are not limited to, a silicon-controlled rectifier (SCR), a Field Effect Transistor (FET), and a bipolar junction transistor (BJT), or insulated gate bipolar transistors (IGBT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. MOSFETS may be formed in silicon, gallium nitride (GaN), silicon carbide (SiC) or other semiconductor materials.

In accordance with the techniques of the disclosure, processing circuitry 104 may be configured to determine, based on the command received at first node 120, an activation setting for an activation characteristic for switch 130 and a deactivation setting for a deactivation characteristic for switch 130. For example, the determined activation setting may include a first rate of change. In this example, a previous activation setting may define a second rate of change different from the first rate of change. To drive switch 130, processing circuitry 104 may be configured to select the first rate of change or the second rate of change based on the received command at first node 120 and to generate a gate voltage of switch 130 with the selected rate of change to activate switch 130.

Processing circuitry 104 may be configured to drive switch 103 based on the commutation signal. For example, processing circuitry 104 may be configured to change, at a first time, the deactivation characteristic for switch 130 from a previous deactivation setting to the determined deactivation setting and change, at a second time that is different from the first time, the activation characteristic for switch 130 from a previous activation setting to the determined activation setting.

Processing circuitry 104 may determine the first time and the second time based on a predetermined time duration. For example, processing circuitry 104 may determine, for a first command received at first node 120, the second time to occur after the first time by at least a predetermined time duration. For a second command received at first node 120, processing circuitry 104 may determine the first time to occur after the second time by at least the predetermined time duration.

Processing circuitry 104 may determine the first time and the second time based on a set of edges of the commutation signal received at second node 122. For example, processing circuitry 104 may determine, for a first command received at first node 120, the second time to occur after the first time by at least a set of edges of the commutation signal. For a second command received at first node 120, processing circuitry may determine the first time to occur after the second time by at least the set of edges of the commutation signal.

Processing circuitry 104 may be configured to apply the determined deactivation setting to reduce an amount of time to deactivate switch 130 from an amount of time to deactivate switch 130 with the previous deactivation setting. In this example, processing circuitry 104 may be configured to apply the determined activation setting to reduce an amount of time to activate switch 130 from an amount of time to activate switch 130 with the previous deactivation setting after processing circuitry 104 has reduced the amount of time to deactivate switch 130.

In some examples, processing circuitry 104 may be configured to apply the determined deactivation setting to increase an amount of time to deactivate switch 130 from an amount of time to deactivate the switch with the previous deactivation setting. In this example, processing circuitry 104 may be configured to apply the determined activation setting to increase an amount of time to activate switch 130 from an amount of time to activate the switch with the previous deactivation setting before processing circuitry 104 has increased the amount of time to deactivate switch 130.

Processing circuitry 104 may be optionally configured to include a third node to receive a second commutation signal different from the first commutation signal. In this example, the activation characteristic may comprises a minimum idle time window between an edge of the second commutation signal received at the third node and an edge of the first commutation signal received at second node 122. Processing circuitry 104 may be configured to prevent an activation of switch 130 after the edge of the first commutation signal for at least the duration of the minimum idle time window starting after the edge of the second commutation signal. In this way, processing circuitry 104 may help to prevent a short circuit condition, for example, when switch 103 is part of a half-bridge switch topology (see FIG. 2).

Figure 2:
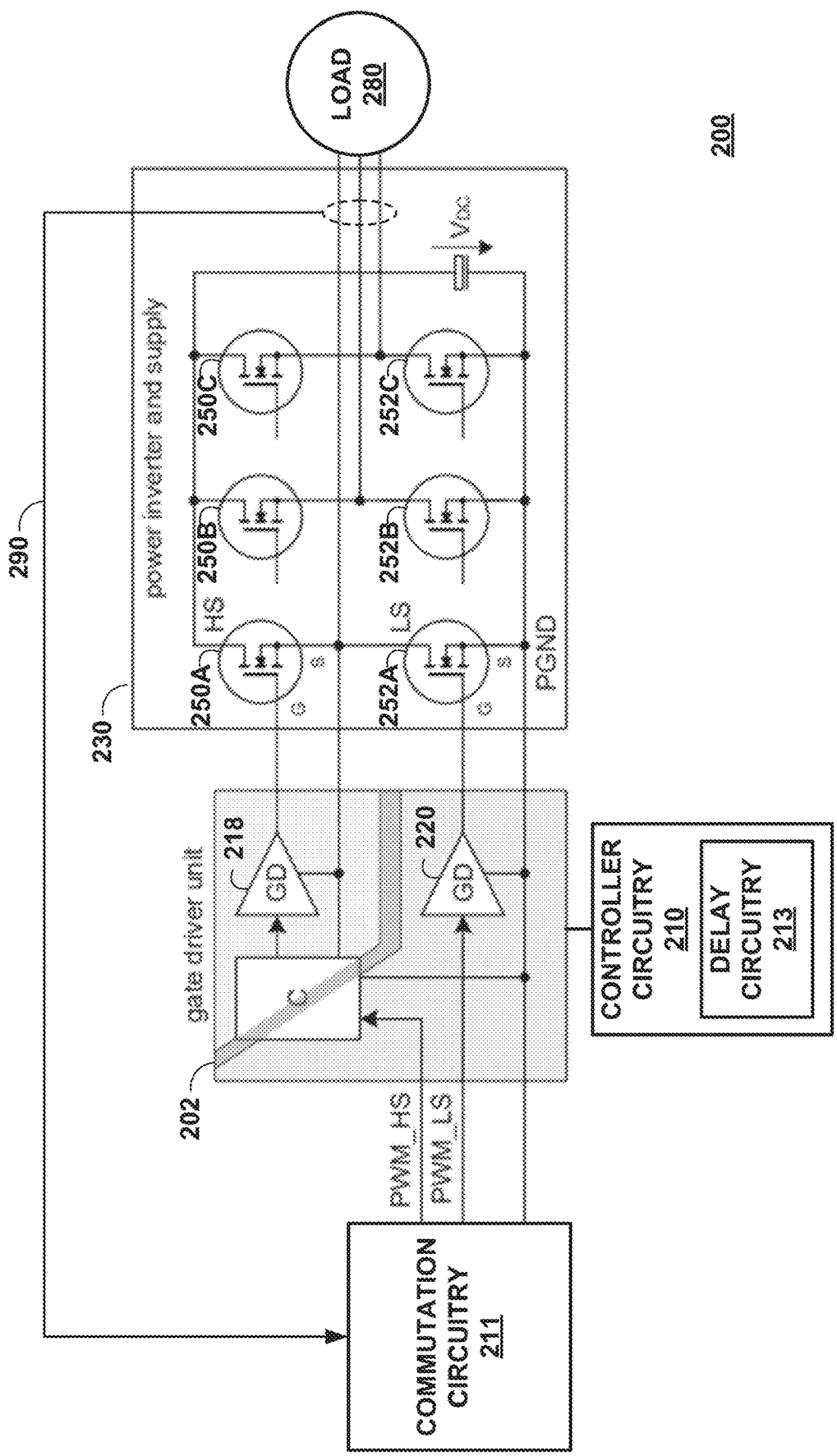
FIG. 2 is a conceptual diagram illustrating an example of a system including a half-bridge switch topology configured to control the commutation of the switches based on commutation signals, in accordance with one or more techniques of this disclosure.

FIG. 2 is a conceptual diagram illustrating an example of a system 200 with a half-bridge switch topology configured to change an activation setting and a deactivation setting of a switch at different times, in accordance with one or more techniques of this disclosure. Techniques described herein may be applied to any power topology and is not limited to motor control. The example of FIG. 2 describes load 280 as a 3-phase AC motor, however, other examples may use other loads.

FIG. 2 illustrates an application block diagram for AC drive operation, e.g. for a load 280 that comprises a 3-phase motor. Load 280 may be connected to a power inverter 230 that is connected to a supply unit delivering the energy to operate the motor ($V_{DC}$). Controller circuitry 210, gate driver unit 202, and power inverter and supply 230 (also referred to herein as simply "power inverter 230") may be examples of controller circuitry 110, driver 102, switch 130 of FIG. 1. In the example of FIG. 2, delay circuitry 213 is arranged in controller circuitry 210. However, in other examples, delay circuitry 213 may be arranged separately from controller circuitry 110. For example, delay circuitry 213 may not be arranged within other components of system 200. In some examples, delay circuitry 213 may be arranged in first driver 218 and second driver 220.

Commutation circuitry 211 may be configured to generate a first commutation signal (e.g., PWM_HS) and a second commutation signal (e.g., PWM_LS). While some examples may refer to PWM, commutation circuitry 211 may be configured to generate other types of modulation signals, such as, for example, pulse frequency modulation (PFM), pulse duration modulation, or pulse density modulation. Commutation circuitry 211 may receive feedback 290 indicating a phase current of load 280. Commutation circuitry 211 may be configured to determine that the phase current of load 280 is positive if feedback 290 indicates that the phase current flows from power inverter 230 to load 280. Similarly, commutation circuitry 211 may be configured to determine that the phase current of load 280 is negative if feedback 290 indicates that the phase current flows from load 280 to power inverter 230. Commutation circuitry 211 may include one or more processors, such as one or more microprocessors, DSPs, ASICs, FPGAs, or any other equivalent integrated or discrete logic circuitry, as well as any combinations of such components. In some examples, commutation circuitry 211 and controller circuitry 210 may form a single integrated circuit.

In this example, power inverter 230 comprises a B6 topology. In a B6 topology, each phase of load 280 is connected to a half-bridge switch topology with a high-side switch (HS, connecting the phase node to the positive supply rail of $V_{DC}$) and a low-side switch (LS, connecting the phase node to the negative supply rail of $V_{DC}$). The B6 topology may represent a simple topology for AC drive operation. Other topologies, such as multi-level converters, can also be used with techniques described herein.

Gate driver unit 202 may represent a link between commutation circuitry 211 generating the switching control signals (PWM_xy) to operate switches 250A-250C, 252A-252C (collectively, switches 250, 252) of power inverter 230 (e.g., on/off control). For example, first gate driver 218 may drive first switch 250A and second gate driver 220 may drive second switch 252A. Each switch of switches 250, 252 can be controlled by commutation circuitry 211, e.g. a microcontroller (µC) or any other type of PWM generation unit.

Gate driver unit 202 may include several voltage domains, due to the structure of the B6 bridge, because each switch of switches 250, 252 may use a control signal with respect to a defined reference level (e.g. the source connection the source (S) of each power switch). The example of FIG. 2 shows the symbols for MOSFET power switches. However, switches 250, 252 may comprise other types of power switches, such as, for example, IGBTs, SiC or GaN switches.

Each switch of switches 250, 252 may be controlled by an individual control signal (G) that is adapted to the desired voltage level by a gate driver (as part of gate driver unit 202). In some cases, e.g. for power MOSFETs, several independent (smaller) switch devices are connected in parallel to increase the overall current capability of the parallel structure. In this disclosure, such a parallel connection may be considered as a single switch, because parallel switches form one bigger switch.

In an example where load 280 comprises a three-phase AC drive and in steady state operation of a three-phase AC drive, the three phase currents Iu, Iv, and Iw may be mainly sine-waves. The frequency of the phase currents may define a rotational speed of load 280 and the amplitude relates to the torque of load 280. Typical phase current frequencies are in the range between 0 and a few 100 Hz, depending on the construction of the motor (e.g. typical frequencies are below 2 kHz for traction inverters).

A relation of the amplitudes of the phase currents change with the rotation of the rotor. In one segment (e.g. segment A), phase current Iu delivers the current with the biggest positive value and phase current Iw shows the most negative phase current. The phase current Iv is somewhere between Iu and Iw. In another segment, the phase currents change values. For a certain while, each phase current is positive and bigger than a positive threshold or negative and lower than a negative threshold. The information whether a phase current is above the upper threshold, below the lower threshold or between both thresholds is related to each phase current (independent from the other phases). Because each phase current is normally handled by an independent inverter part (e.g., an inverter bridge leg, e.g. a half-bridge topology built with one HS and one LS switch), the information can also be considered independent for each independent inverter bridge leg.

In order to generate the "smooth" phase currents with reasonable losses in the switches 250, 252 may be operated in on/off mode, controlled by the PWM signals generated by commutation circuitry 211. The duty cycle (e.g., a relation between on-time of a switch and PWM period) of each switch in relation to the other switches of switches 250, 252 defines the resulting phase current shape. The JR time constant of the motor winding smoothens the effects of the on/off operation of switches 250, 252. The PWM frequency of switches 250, 252 may be much bigger than the frequency of the phase currents. Typical PWM frequency values may be in the range from 4 kHz to 30 kHz, depending on the switch and the maximum phase current amplitude. As such, a certain number of PWM periods (on/off cycles of a switch) in each of the segments occurs.

There are mainly two types of losses in a switch: (1) Conduction losses, due to the voltage drop over the switch in conducting mode and the current through the switch; and (2) Commutation losses, due to the switching activity (on/off=conducting/not conducting) of the switch, as controlled by the PWM signals. The commutation losses may depend on the way how switches 250, 252 are driven by gate driver unit 202, e.g. the amount and profile of the gate current for each on/off and off/on transition of the switch.

Furthermore, the timing of the PWM signals between the two switches on the high-side and the low-side of the same motor phase influences the commutation losses (e.g., dead-time). Dead-time may represent a short time during the on/off transition of one of the two switches (e.g., switch 250A) and the off/on transition of the other of the two switches (e.g., switch 252A). During dead-time, both switches (e.g., switch 250A. 252A) are controlled to be off, to avoid a short circuit in the inverter bridge leg (break before make). Both, the shape of the gate current as well as the dead time can be used to reduce the commutation losses. The amplitude of the phase currents change with motor rotation. As such, the shape of the gate currents and the dead time may be dynamically adapted to the actual phase current value to reduce the commutation losses.

A set of commutation parameters may define a commutation speed and influence commutation losses, such as gate current value, gate current shape, gate voltage, dead-time. To minimize the commutation losses, controller circuitry 210 may adapt one or several of these parameters to the actual phase current. For a higher current value, a faster commutation can be beneficial regarding the losses. A faster commutation may lead to higher noise effects (EMI) that should be avoided. As such, system 200 may be configured for a compromise between commutation losses, which may be reduced using a faster commutation, and EMI behavior, which may be improved using a slower commutation. As such, system 200 may benefit from a change in the commutation characteristics depending on the actual phase current. In the simplest version, controller circuitry 210 may use a fast commutation characteristic and a slow commutation characteristic. However, techniques may use more than two commutation characteristics. Moreover, commutation characteristics may comprise parameters other than frequency, for example, a first commutation characteristic may comprise a first rate of change that is different than a second rate of change for a second commutation characteristic.

In accordance with the techniques of the disclosure, controller circuitry 210 may output a first command to gate driver unit 202. In this example, commutation circuitry 211 may be configured to generate a first commutation signal and a second commutation signal. First driver 218 may be configured to activate a first switch 250A based on the first commutation signal and a first activation characteristic for first switch 250A and to deactivate first switch 250A based on the first commutation signal and a first deactivation characteristic for first switch 250A. First driver 218 may be configured to change, at a first time after the first command, the first activation characteristic for first switch 250A from a first previous activation setting to a first following activation setting.

The first activation characteristic for first switch 250A may influence a duration of a commutation of first switch 250A from a deactivated state to an activated state and the first deactivation characteristic for first switch 250A may influence a duration of a commutation of first switch 250A from the activated state to the deactivated state. For example, the first previous activation setting comprises a first rate of change and the first following activation setting may comprise a second rate of change different from the first rate of change. In this example, to activate first switch 250A, first driver 218 may be configured to select the first rate of change or the second rate of change based on the first command and to generate a gate voltage at first switch 250A with the selected rate of change to activate first switch 250A.

Second driver 220 may be configured to activate second switch 252A based on the second commutation signal and a second activation characteristic for second switch 252A and to deactivate second switch 252A based on the second commutation signal and a second deactivation characteristic for second switch 252A. Second driver 220 may be configured to change, at a second time after the first command that is different to the first time, the second deactivation characteristic from a first previous deactivation setting to a second following deactivation setting. The second activation characteristic for second switch 252A may influence a duration of a commutation of second switch 252A from the deactivated state to the activated state and the second deactivation characteristic for second switch 252A may influence a duration of a commutation of second switch 252A from the activated state to the deactivated state. The second time may be different from the first time by at least a predetermined time duration. In some examples, the second time may be different from the first time by at least a set of edges of the first commutation signal.

For example, second driver 220 may be configured to apply the second following deactivation setting to reduce an amount of time to deactivate second switch 252A from an amount of time to deactivate the second switch with the second previous deactivation setting. In this example, first driver 218 may be configured to apply the first following activation setting to reduce an amount of time to activate first switch 250A from an amount of time to activate first switch 250A with the first previous activation setting after second driver 220 has reduced the amount of time to deactivate the second switch.

Delay circuitry 213 may cause, based on the first command, first driver 218 to change, at the first time, the first activation characteristic for first switch 250A from the first previous activation setting to the first following activation setting. In this example, delay circuitry 213 may cause, based on the first command, second driver 220 to change, at the second time, the second activation characteristic for second switch 252A from the second previous deactivation setting to the second following deactivation setting.

Similarly, delay circuitry 213 may cause first driver 218 to change, at the first time, the first activation characteristic for first switch 250A from the first previous activation setting to the first following activation setting based further on the first commutation signal. In this example, delay circuitry 213 may cause second driver 220 to change, at the second time, the second activation characteristic for second switch 252A from the second previous deactivation setting to the second following deactivation setting based further on the second commutation signal.

In some examples, controller circuitry 210 may output a second command to gate driver unit 202. In this example, first driver 218 may be configured to change, at a third time after the second command, the first activation characteristic for first switch 250A from a third previous activation setting to a third following activation setting. Similarly, second driver 220 may be configured to change, at a fourth time after the second command that is different to the third time, the second activation characteristic from a fourth previous deactivation setting to a fourth following deactivation setting. In some examples, the fourth time may be shorter than the third time.

Figure 3:
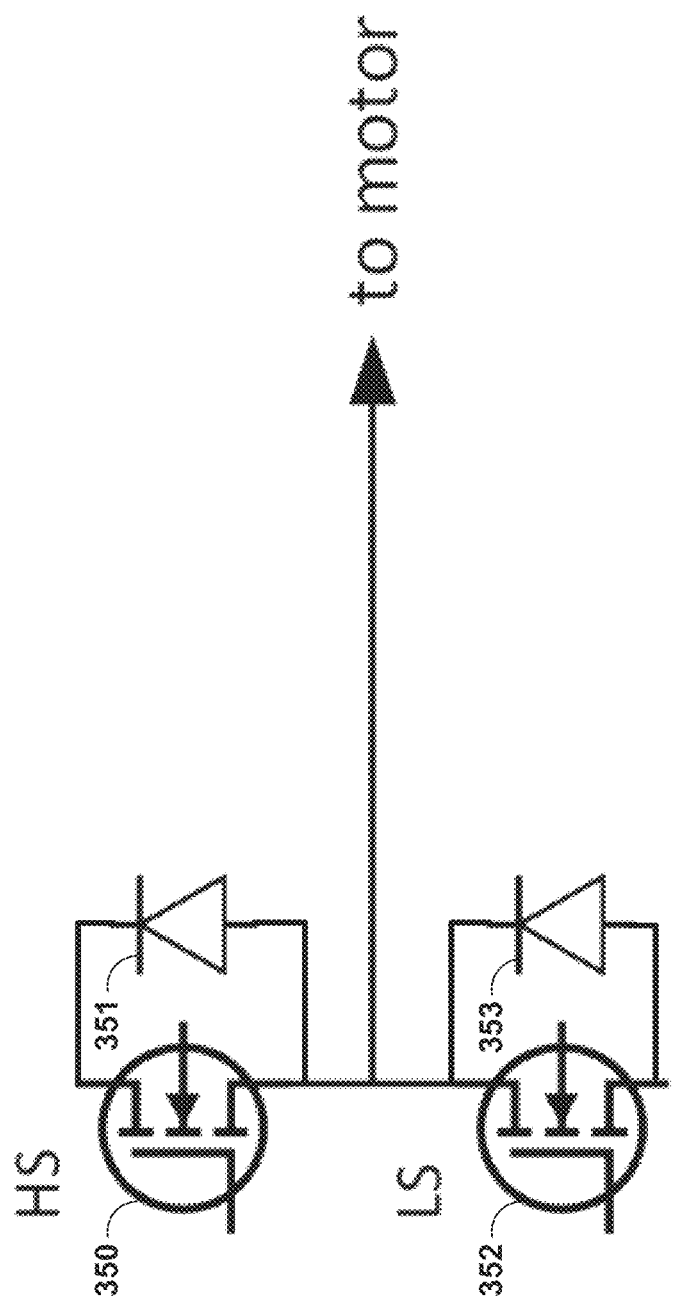
FIG. 3 is a conceptual diagram illustrating an example half-bridge switch, in accordance with one or more techniques of this disclosure.

FIG. 3 is a conceptual diagram illustrating an example half-bridge switch 330, in accordance with one or more techniques of this disclosure. In a power inverter topology, each power switch has a parallel freewheeling diode. For example, high side (HS) power switch 350 comprises freewheeling diode 351 and low side (LS) power switch 352 comprises freewheeling diode 353. Freewheeling diode 351 can be either an intrinsic diode of HS power switch 350 or a separate diode. Similarly, freewheeling diode 353 can be either an intrinsic diode of LS power switch 352 or a separate diode. Freewheeling diode 351 can take over current if HS power switch 350 is switched off or if LS power switch 352 is switched off, depending on the direction of the current. FIG. 3 shows an inverter bridge leg including of a HS power switch 350 and a LS power switch 352, for example, as part of a B6 topology.

Generally, the conduction losses of a freewheeling diode (e.g., freewheeling diodes 351, 353) are higher compared to conduction losses when conducting with a power switch (e.g., power switches 350, 352). As a consequence, the conduction losses can be reduced if the time interval where the freewheeling diode conducts the current are reduced, e.g. by activating the parallel power switch to commutate the current from the freewheeling diode to the power switch.

In an example of a positive phase current (e.g., current flow from half-bridge switch 350 to the motor), a positive phase current flows from half-bridge switch 350 to the motor. If power switches 350, 352 are switched off, the phase current continues flowing (due to the inductance of the windings) and establishes a current path through freewheeling diode 353 of power switch 352 (e.g., the low side power switch).

In general, there may always be a dead-time between the deactivation of one switch and the activation of the other switch of a half-bridge to help to ensure break-before-make of the conduction phases of the power switches. The dead-time allows for a transition from non-conducting to conducting (switch on) and vice-versa (switch off) and may strongly depend on the operating conditions of the switches and a lot of parasitic effects. In other words, an exact timing cannot be predetermined and the switch-on transition can be faster than the switch-off transition. The dead-time (e.g., when both switches are controlled off) is introduced (e.g., by a PWM generator) to help to ensure correct commutation without short circuits. During dead-time, the phase currents continue flowing, but change from a conducting power switch to a freewheeling diode.

In the case of a conducting HS power switch 350 being switched off. A positive phase current commutates from HS power switch 350 to freewheeling diode 353 of LS power switch 352. As a consequence, the voltage of the phase node (connection point between HS power switch 350 and LS power switch 352) changes from $V_{DC}+$ (minus voltage drop over conducting HS power switch 350) to the voltage drop over freewheeling diode 353 of LS power switch 352. If the dead-time is much longer than the time needed for the current transition from HS power switch 350 to freewheeling diode 353 of low side power switch 352, both power switches 350, 352 stay off and the freewheeling diode 353 influences the conduction losses.

In the opposite case, a positive phase current passing through an active LS power switch 352. When LS power switch 352 gets deactivated by the PWM, the current commutates from the LS power switch 352 to freewheeling diode 353 of the LS power switch 352. In this case, the voltage of the phase node does not change significantly. The duration of a current commutation from one active switch to the opposite freewheeling diode is different to the duration of the commutation from one active switch to the freewheeling diode of the same switch. A dead-time that is selected or possibly optimized for conduction loss reduction also needs to respect the different commutation scenarios.

In other words, an optimized dead-time for a commutation from HS power switch 350 to LS power switch 352 for a positive phase current is different to the dead-time for the same commutation, but for a negative phase current. Furthermore, the dead-times for the commutation to LS power switch 352 and to HS power switch 350 are also different for HS power switch 350 and LS power switch 352.

The phase current direction within a range of values during the PWM period is always the same (either always positive or always negative). In the area between the range of values, the phase current direction may change during a PWM period. It is much simpler to set an appropriate dead-time if the current direction is known. Therefore, for a phase current between the range of values, the dead-time for power switches 350, 352 can be set to a relatively high value (compared to an optimized value) in this area. The wording "relatively high" may depend on the type of power switches used and can be in a range of, for example, 100 ns to a few µs. Even if the range of values is assumed to be a little bit bigger than absolutely needed (to deal with parasitic effects and unknown effects). The additional losses are not very important because the value of the phase currents is still smaller compared to current values outside of the range of values.

A desirable dead-time handling allows individual setting for HS power switch 350 and the LS power switch 352 depending on the value of the phase current. The dead-time between the PWM control signals is most commonly generated digitally in the PWM generator of the control device. To avoid damage of the power conversion system in case of a program error or a local error in the control device, the gate driver unit 202 may support a minimum dead-time check. If the dead-time introduced by controller circuitry 210 is smaller than a minimum dead-time defined in gate driver unit 202, gate driver unit 202 respects the minimum dead-time to protect the circuit. If the dead-time introduced by controller circuitry 210 is longer than the minimum dead-time, the longer dead-time is respected. In order to provide protection against errors in the PWM generation in controller circuitry 210 and to support dead-time optimization to reduce losses in power switches 350, 352, an adjustable minimum dead-time in gate driver unit 202 is advantageous.

Another aspect of an optimized commutation refers to the speed and the characteristics of the commutation itself. This relates to the shape of the voltage and the current of a power switch (e.g., power switches 350, 352) during the transitions from on to off and vice versa. For example, a faster transition allows for a shorter dead-time and reduced losses, but may lead to higher EMI effects (electro-magnetic interference). EMI effects are relevant for the design of all power conversion systems. Applying different shapes for the commutation from on to off, from off to on, for HS or for LS can reduce losses and improve EMI behavior depending on the areas above, between or below the range of values (dependency on phase current value). A dynamic change of parameters defining the commutation behavior of the power switches by gate driver unit 202 may be advantageous.

Figure 4:
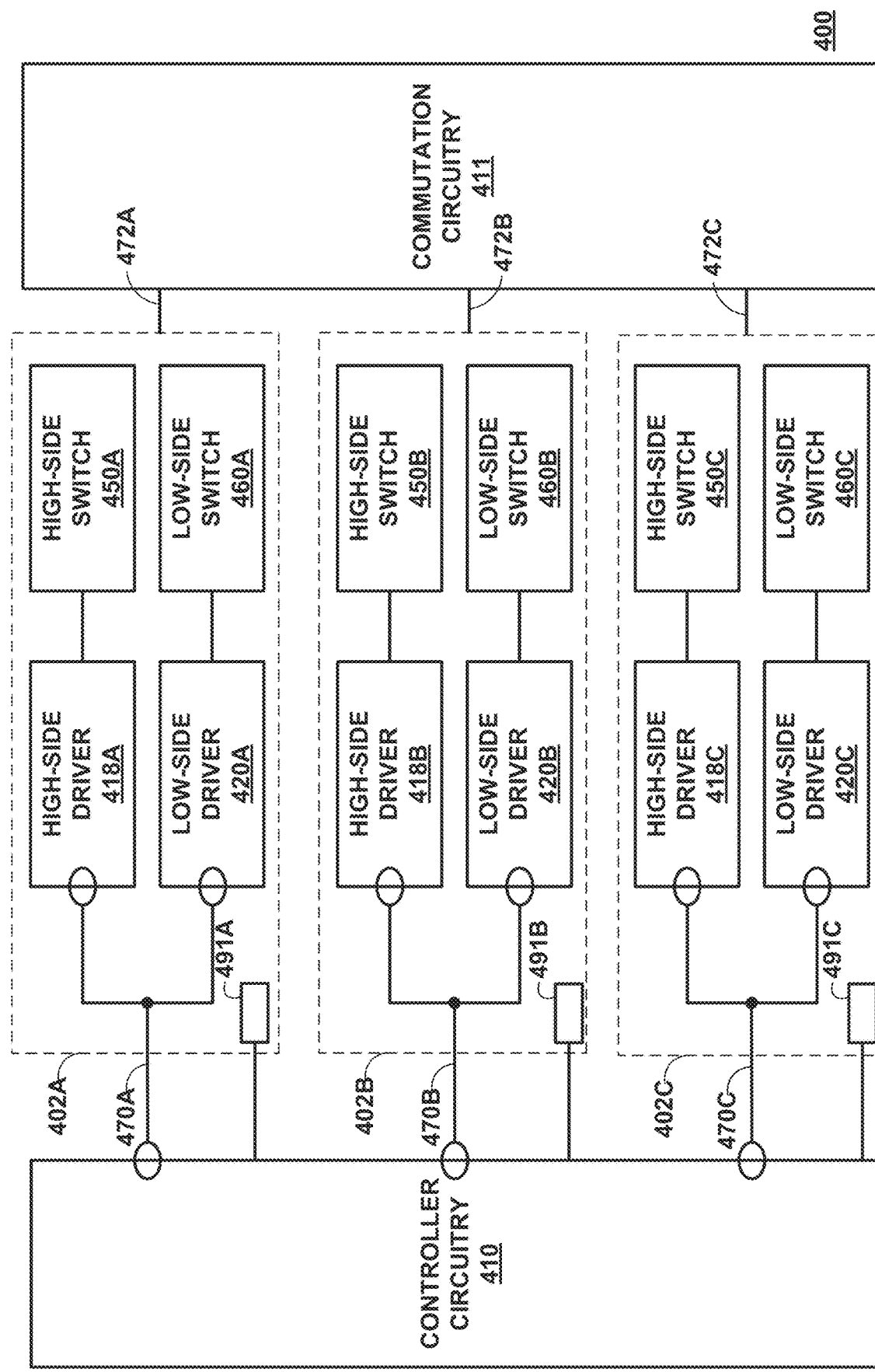
FIG. 4 is a conceptual diagram illustrating an example of a first system comprising first phase circuitry, second phase circuitry, and third phase circuitry, in accordance with one or more techniques of this disclosure.

FIG. 4 is a conceptual diagram illustrating an example of a first system 400 comprising first phase circuitry 402A, second phase circuitry 402B, and third phase circuitry 402C, in accordance with one or more techniques of this disclosure. As shown first phase circuitry 402A may include a high-side driver 418A configured to drive high-side switch 450A and a low-side driver 420A configured to drive low-side switch 460A. Similarly, second phase circuitry 402B may include a high-side driver 418B configured to drive high-side switch 450B and a low-side driver 420B configured to drive low-side switch 460B. Further, third phase circuitry 402C may include a high-side driver 418C configured to drive high-side switch 450C and a low-side driver 420C configured to drive low-side switch 460C. Controller circuitry 410 may be an example of controller circuitry 110 of FIG. 1.

Commutation circuitry 411 may be configured to generate a first set of commutation signals for first phase circuitry 402A and a second set of commutation signals for second phase circuitry 402B. In some examples, commutation circuitry 411 may be configured to generate a third set of commutation signals for third phase circuitry 402C. First phase circuitry 402A may comprise first current sensing circuitry 491A configured to sense a first current flowing through first phase circuitry 402A and to deliver first information about the sensed first current to controller circuitry 410. Similarly, second phase circuitry 402B may comprise second current sensing circuitry 491B configured to sense a second current flowing through second phase circuitry 402B and to deliver first information about the sensed second current to controller circuitry 410. Further, third phase circuitry 402C may comprise third current sensing circuitry 491C configured to sense a third current flowing through third phase circuitry 402C and to deliver first information about the sensed third current to controller circuitry 410.

In this accordance with techniques described herein, system 400 may be configured to distribute and handle control signals (also referred to herein as "commands") 470A-470C (collectively, control signals 470 or simply "commands 470") influencing the commutation behavior of switches 450A-450C, 460A-460C to reduce commutation losses. Controller circuitry 410 may generate control signals 470 depending on the operation parameters of each phase of a motor. e.g. the phase currents. When using a minimum two sets of commutation parameters, a first set of parameters for a slow commutation and a second set of parameters for a fast commutation may be predefined in the gate driver circuit (e.g., high-side drivers 418A-418C and/or low-side drivers 420A-420C) or may be configured by the controller circuitry 410 (e.g. via a communication interface to the gate driver).

A scheduling or delay mechanism may be introduced for switches 450A-450C. 460A-460C of the same half bridge to avoid the following scenarios. In a scenario that comprises a transition from a slow commutation to a fast commutation, where one switch is conducting and still works according to the slow commutation parameters and the other switch would start a fast commutation to switch on. For instance, low-side switch 460A may be switched to an active state (e.g., switched-on) according to slow commutation parameters and high-side driver 418A may drive high-side switch 450A to the active state according to fast commutation parameters.

Another scenario comprises a transition from fast commutation to a slow commutation, where one switch is not conducting and still works according to the fast commutation parameters and the other switch would start a slow commutation to switch off. For instance, high-side switch 450A may be switched to an active state (e.g., switched-in) according to fast commutation parameters and low-side switch 460A may remain switched to the active state according to the slow commutation parameters. In these two example scenarios and/or potentially other scenarios system 400 may be configured to help to ensure that the switch switching off has stopped conducting before the switch switching on starts conducting.

For example, the example scenarios may occur if there is a delay between both gate driver units (e.g., low-side driver 420A and high-side driver 418A) in receiving the request to switch from the slow commutation to the fast commutation. If the gate driver unit switching off receives the request later (e.g., due to noise or other filter effects, such as spread in the filter times between devices) than the gate driver unit switching on, an overlap of both switches conducting should be minimized to avoid a short circuit.

In the example of FIG. 4, command 470A may be transmitted by a data channel between an output of controller circuitry 410 and both high-side driver 418A and low-side driver 420A for first phase circuitry 402A. Similarly, command 470B may be transmitted by a data channel between an output of controller circuitry 410 and both high-side driver 418B and low-side driver 420B for second phase circuitry 402B. Further, command 470C may be transmitted by a data channel between an output of controller circuitry 410 and both high-side driver 418C and low-side driver 420C for third phase circuitry 402C. The data channels can be any type of communication path, e.g. a digital data signal (0 or 1 to select between 2 parameter sets, or PWM-coded to select between more parameter sets), a serial data bus, or an analog signal (e.g. different amplitudes or frequencies lead to different parameter sets). Controller circuitry 410 may use the data channels to transfer information about the commutation or a selection signal from the control device to the gate driver circuits.

According to techniques described herein, system 400 may apply a scheduling mechanism when the request to change the commutation behavior. In the example of FIG. 4, the scheduling mechanism may be located in the gate driver device (e.g., high-side drivers 418A-418C and/or low-side drivers 420A-420C).

In the example of FIG. 4, a common data channel is used for the configuration or selection of the parameters defining a commutation. In this example, both the low-side driver 420A for low-side switch 460A and high-side driver 418A for high-side switch 450A get the same information from the data channel. Similarly, both the low-side driver 420B for low-side switch 460B and high-side driver 418B for high-side switch 450B get the same information from the data channel. Further, both the low-side driver 420C for low-side switch 460C and high-side driver 418C for high-side switch 450C get the same information from the data channel.

In some examples, the commutation behavior may comprise adjustable commutation parameters (e.g. dead-times applied by commutation circuitry 411 and minimum dead-times as a disaster check in the gate driver unit selected by controller circuitry 410, voltages or currents at the control terminals of the power switches delivered by the driver circuits), depending on the actual phase current value and the type and location of the switch (e.g. a high-side switch or a low-side switch).

Each driver circuit may be configured to support different configurations to apply different parameters derived from a common communication signal. For example, low-side driver 420A and high-side driver 418A may be configured to support different configurations to apply different parameters derived from command 470A. The configurations may be stored locally (e.g. in NVM—non-volatile memory, such as Flash, OTP—one time programmable, or (E)EPROM—electrically programmable read only memory) or stored in the control unit (same type of storage mechanisms) and then be transferred during run-time. The data defining the commutation parameters may be "quasi" static (e.g. some sets of configuration data available in driver unit and selected by information transferred via the data channel) or dynamical (updated during run-time via the data channel).

Because the driver circuits of a same half-bridge (or similar topology, referring to the same phase current) in the gate driver unit may be connected to the same data channel, an enumeration of each single driver unit is necessary. Enumeration means that each driver unit has a unique "name" or "knowledge" about how it has to interpret information handed over via the common data channel.

As an example, low-side driver 420A can extract information about low-side switch 460A and high-side driver 418A can extract information about high-side switch 450A from the data channel to identify command 470A. In this case, the data channel may provide data targeting a HS driver and other data targeting a LS driver (different data parts and driver circuits only "look at their data"). This can be simply realized if the data channel is a serial communication interface, such as a UART interface.

In some examples, the driver circuit may "know" how an input signal (data channel) has to be interpreted. For example, the data channel selects between parameter sets SET0, SET1, and SET2. The assignment between the input signal and the selection of SETx is the same in all driver circuits, but the contents of the SETx is different for a first driver circuit compared to SETx of a second driver circuits. Here, the driver circuits get the same selection information, but—at the end—react differently, because the contents of SETx are different for the driver circuits. There is no need to make all driver units unique for the complete power conversion system (e.g. power inverter); only those need to be unique that are referring to the same data channel.

There are several possibilities to make a driver unit unique, but many of the possibilities rely on at least at a defined moment during the operation of the driver circuits, one driver circuit gets a different information than the other(s). One way to make a driver unique is to use a dedicated connection to the driver unit (e.g. a pin) that is tied to a defined value. This can be done via the PCB layout of the driver circuit (e.g., pin strapping). Another way to make a driver unit unique is to use already existing signals that are unique for each driver circuit, such as the PWM signal. In an initialization mode, the PWM signal may be used to identify the position and the role of a driver circuit instead of switching on or off. While the above examples may be used for enumeration, other types of enumeration may be used.

Another way to achieve uniqueness is a daisy chain communication topology, such as known from SPI communication topologies. Here, the communicating devices are connected in a chain and the place in the chain makes each device unique. This can be used to set up the parameter sets individually for each driver circuit via a communication interface that allows unique handling (we can consider this also as a hard-wired enumeration).

Compared to driver units known in LV (low voltage) applications, the gate driver unit for HV (high voltage) applications are different. In HV applications, driver circuits are mainly independent circuits and data exchange between different circuits is very difficult and costly (due to high voltage differences between the circuits). This may lead to techniques established in LV applications not being used in a HV application.

One way to change the commutation behavior would be to transfer all required data during run-time to all driver circuits. During run-time means that the commutation control parameters are updated when the phase current passes a defined range of thresholds. However, the costs for a communication channel providing enough bandwidth for the complete transfer from controller circuitry 410 to the gate driver units may be high to establish such a connection. As such, techniques described herein may help to reduce the bandwidth used for the complete transfer of commutation behavior and may help to allow the use of simple mechanisms to select the necessary parameters.

A process to operate a gate driver unit with separated driver circuits for controlling separated power switches (e.g. in HV applications) includes establishing at least one group of driver circuits referring to the same communication channel (data channel), making each driver circuit unique (statically or dynamically) within a group of driver circuits, setting up several parameter sets for different commutation behaviors, and transmitting selection information to the driver circuits of the group to select one of the several parameter sets.

In some examples, controller circuitry 410 may transmit a common selection information in the group, leading to a selection of a parameter set in each driver circuit, where the contents of a parameter set is different for a first driver circuit of the group and a second driver circuit of the group. In a second option, controller circuitry 410 may transmit a set of selection information in the group, where each driver circuit is sensitive to a part of the selection information (relevant part of the set) and where the contents of the relevant part is different for a first driver circuit of the group and a second driver circuit of the group.

The process to operate the gate driver unit with separated driver circuits may further including changing the commutation behavior of a driver circuit according to the selected parameter set as response to the data transferred via the communication channel, e.g. depending on the phase current amplitude. The communication (data) channel can be, for example, digital. For example, controller circuitry 410 may be configured to output information coded in the level, e.g. 0 or 1 to select between two parameter sets. In some examples, controller circuitry 410 may be configured to output information coded in frequency or duty cycle, e.g. a duty cycle between 20%-30% selects SET0, a duty cycle between 45%-55% selects SET1, a duty cycle between 70%-80% selects SET2. The communication channel may be analog. For example, controller circuitry 410 may be configured to output information coded in amplitude, e.g. a voltage between 1.0V-2.0V selects SET0, a voltage between 2.25V-3.25V selects SET1, a voltage between 3.5V-4.5V selects SET2. In a coding that does not use the complete available value range, system 400 may check for out-of-valid-range data, e.g. a duty cycle of 0% or 100% or of 0V (=stuck-at error) as additional plausibility check with appropriate error reaction (e.g. always selecting a slow commutation).

In accordance with the techniques of the disclosure, controller circuitry 410 may be configured to generate a first command 470A and a second command 470B. Commutation circuitry 411 may be configured to generate a first set of commutation signals 472A and a second set of commutation signals 472B.

In this example, first phase circuitry 402A may include a first driver (e.g., high-side driver 418A) and a second driver (e.g., low-side driver 420A) configured to drive a first switch (e.g., high-side switch 450A) and a second switch (e.g., low-side switch 460A) based on first set of commutation signals 472A and the first command 470A. Similarly, second phase circuitry may include a third driver (e.g., high-side driver 418B) and a fourth driver (e.g., low-side driver 420B) configured to drive a third switch (e.g., high-side switch 450B) and a fourth switch (e.g., low-side switch 460B) based on a second set of commutation signals 472B and the second command 470B.

First current sensing circuitry 491A may be configured to sense a first current flowing through first phase circuitry 402A and to deliver first information about the sensed first current to controller circuitry 410. In this example, controller circuitry 410 may be configured to output first command 470A depending on the first information about the sensed first current to first phase circuitry 402A. Similarly, second current sensing circuitry 491B may be configured to sense a second current flowing through second phase circuitry 402B and to deliver second information about the sensed second current to controller circuitry 410. In this example, controller circuitry 410 may be configured to output second command 470B depending on the second information about the sensed second current to second phase circuitry 402B. Further, third current sensing circuitry 491C may be configured to sense a third current flowing through third phase circuitry 402C and to deliver third information about the sensed third current to controller circuitry 410. In this example, controller circuitry 410 may be configured to output third command 470C depending on the third information about the sensed third current to third phase circuitry 402C.

Figure 5:
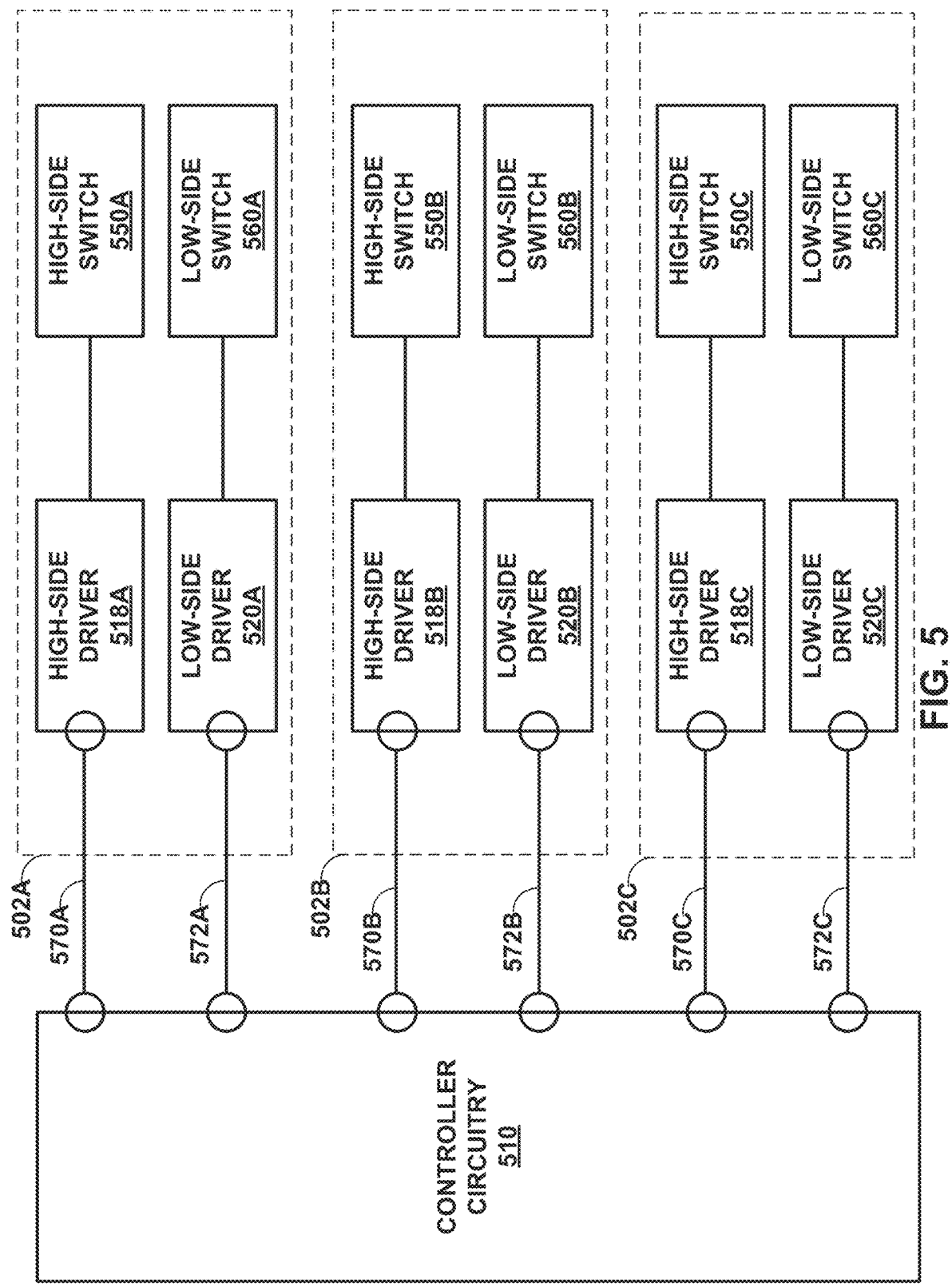
FIG. 5 is a conceptual diagram illustrating an example of a second system configured to change an activation setting and a deactivation setting of a switch at different times that comprises first phase circuitry, second phase circuitry, and third phase circuitry, in accordance with one or more techniques of this disclosure.

FIG. 5 is a conceptual diagram illustrating an example of a second system 500 configured to change an activation setting and a deactivation setting of a switch at different times that comprises first phase circuitry 502A, second phase circuitry 502B, and third phase circuitry 502C, in accordance with one or more techniques of this disclosure. As shown first phase circuitry 502A may include a high-side driver 518A configured to drive high-side switch 550A and a low-side driver 520A configured to drive low-side switch 560A. Similarly, second phase circuitry 502B may include a high-side driver 518B configured to drive high-side switch 550B and a low-side driver 520B configured to drive low-side switch 560B. Further, third phase circuitry 502C may include a high-side driver 518C configured to drive high-side switch 550C and a low-side driver 520C configured to drive low-side switch 560C. Controller circuitry 510 may be an example of controller circuitry 110 of FIG. 1.

In the example of FIG. 5, enumeration may comprise using a dedicated, unique data channel per driver circuit. This is a kind of enumeration by hard-wiring. But this could increase the number of signals generated by controller circuitry 510 and connected to the gate driver unit. In this example, control signals 570 to select between the commutation types can be handed over independently to each gate driver. In this case, the effort for communication may be high or an individual signal is needed for each gate driver. On the other hand, the HS and the LS switch of the same half-bridge (e.g., high-side switch 550A and low-side switch 560A) have to deal with the same phase current so the selection may be done together for both switches.

Figure 6:
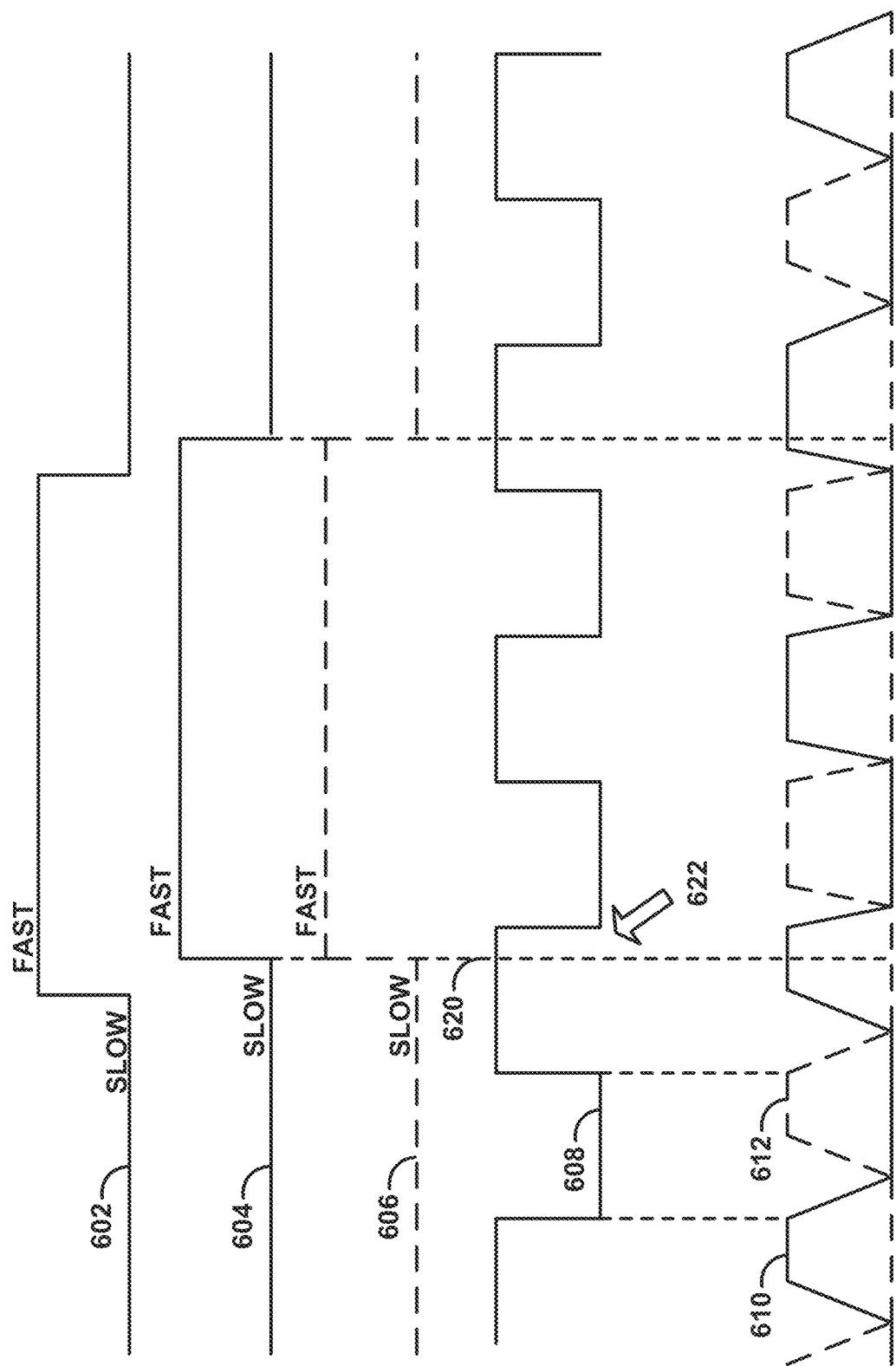
FIG. 6 is a timing diagram illustrating commutation behavior without a short circuit, in accordance with one or more techniques of this disclosure.

FIG. 6 is a timing diagram illustrating commutation behavior without a short circuit, in accordance with one or more techniques of this disclosure. The abscissa axis of FIG. 6 represents time and the ordinate axis of FIG. 6 represents a requested communication behavior signal 602, an applied communication behavior signal 604 for a first driver (e.g., high-side driver 418A of FIG. 3), an applied communication behavior signal 606 for a second driver (e.g., low-side driver 420A FIG. 3), a reference pulse-width modulation (PWM) signal 608, a commutation progress signal 610 for the first driver, and a commutation progress signal 612 for the second driver.

To simplify the following drawings, only one reference PWM (e.g., PWM signal 608) is shown in FIG. 6 for both drivers. The dead-time is introduced for the gate driver circuit that changes from "not conducting" to "conducting" state. FIG. 6 shows a correct change of the commutation behavior of the gate drivers of one half-bridge. At time 620, a change of the commutation behavior is requested by controller circuitry and output to the gate driver circuits. In the example of FIG. 6, the gate driver circuits both apply the "new" behavior at the same PWM transition, therefore there is no risk of a half-bridge short circuit. For example, both applied communication behavior signal 604 and applied communication behavior signal 606 transition from the slow commutation behavior to the fast commutation behavior at PWM transition 622. To avoid unexpected behavior or timings, a commutation that has started should be finished with the same commutation parameter setting (no change during a commutation).

Figure 7:
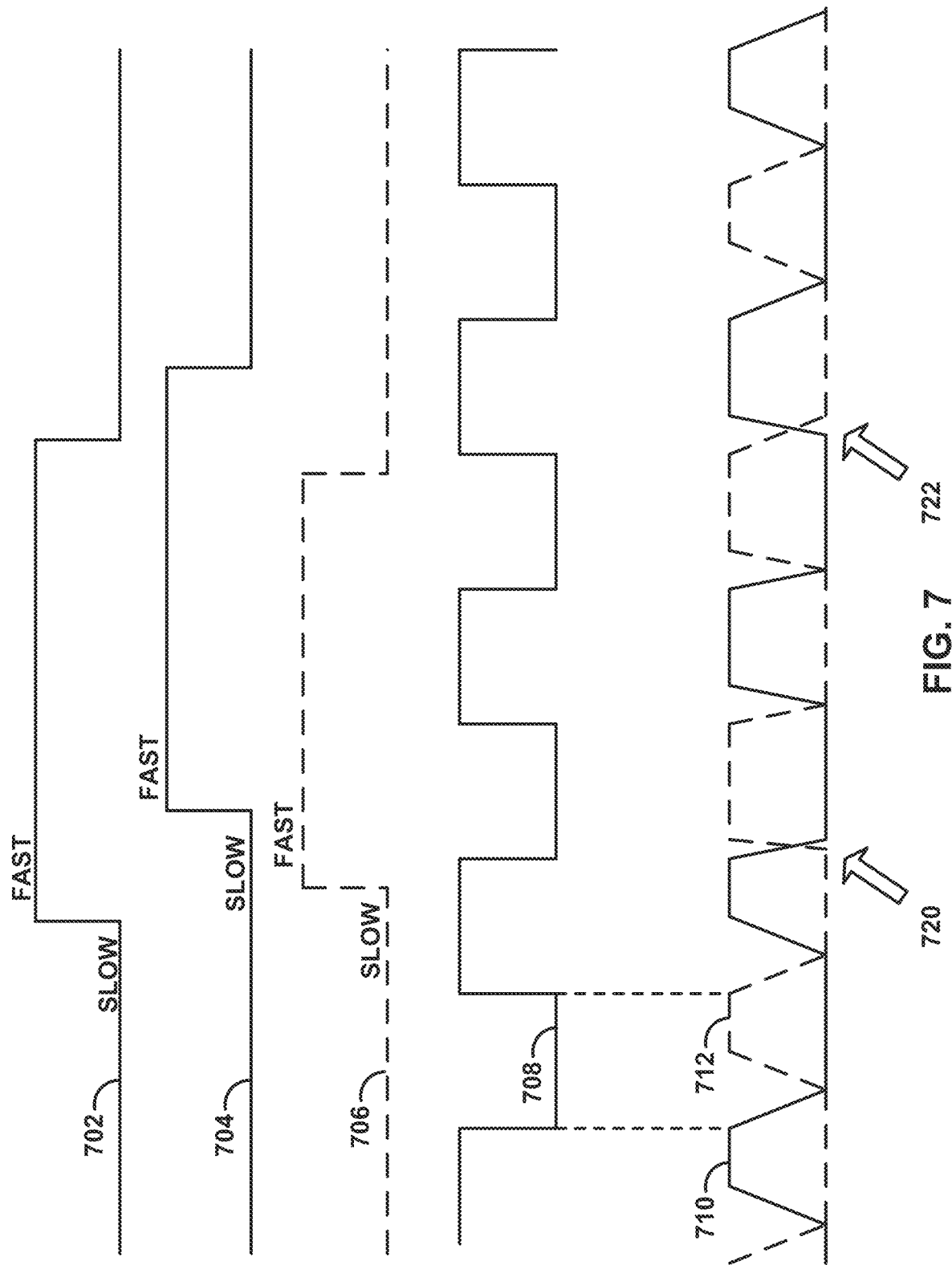
FIG. 7 is a timing diagram illustrating commutation behavior with a short circuit, in accordance with one or more techniques of this disclosure.

FIG. 7 is a timing diagram illustrating commutation behavior with a short circuit, in accordance with one or more techniques of this disclosure. The abscissa axis of FIG. 7 represents time and the ordinate axis of FIG. 7 represents a requested communication behavior signal 702, an applied communication behavior signal 704 for a first driver (e.g., high-side driver 418A of FIG. 3), an applied communication behavior signal 706 for a second driver (e.g., low-side driver 420A FIG. 3), a reference pulse-width modulation (PWM) signal 708, a commutation progress signal 710 for the first driver, and a commutation progress signal 712 for the second driver.

In the example of FIG. 7, the first gate driver has a delay compared to the second gate driver for applying the requested commutation behavior. For example, applied communication behavior signal 704 transitions from the slow commutation behavior to the fast commutation behavior after applied communication behavior signal 706 transitions from the slow commutation behavior to the fast commutation behavior. As a consequence, there is a risk that a fast switch on commutation collides with a slow switch off commutation as shown at event 720 and event 722. In general, events 720, 722 could be avoided by adding more dead-time for the fast commutation, but adding more dead-time may lead to increased losses.

Figure 8:
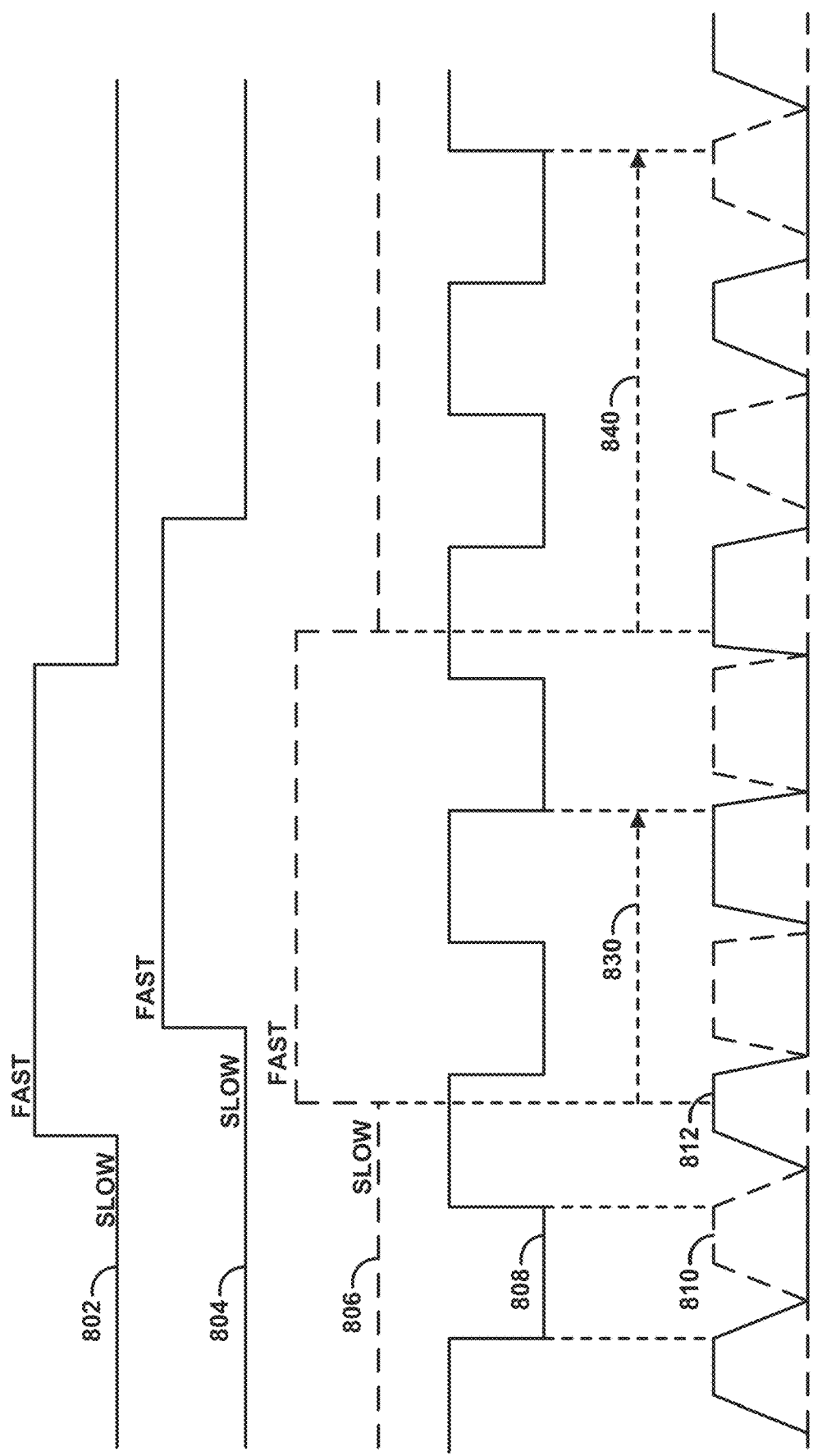
FIG. 8 is a timing diagram illustrating commutation behavior with a change in an activation setting and in a deactivation setting of a switch at different times, in accordance with one or more techniques of this disclosure.

FIG. 8 is a timing diagram illustrating commutation behavior with a change in an activation setting and in a deactivation setting of a switch at different times, in accordance with one or more techniques of this disclosure. The abscissa axis of FIG. 8 represents time and the ordinate axis of FIG. 8 represents a requested communication behavior signal 802, an applied communication behavior signal 804 for a first driver (e.g., high-side driver 418A of FIG. 3), an applied communication behavior signal 806 for a second driver (e.g., low-side driver 420A FIG. 3), a reference pulse-width modulation (PWM) signal 808, a commutation progress signal 810 for the first driver, and a commutation progress signal 812 for the second driver.

FIG. 8 illustrates an example remedy for the mentioned problems of FIG. 7 and potentially other problems according to techniques described herein. The behavior of the commutation that does not lead to a risk can be changed immediately (or with a small delay), whereas the behavior of the commutation that may lead to a risk is changed with a delay (or a bigger delay). For example, system 100 may be configured to add first delay 830 to delay a transition from activating a switch using the slow commutation behavior to using the fast commutation behavior. In this way, system 100 may help to prevent event 720 of FIG. 7. In some examples, system 100 may be configured to add second delay 840 to delay a transition from deactivating a switch using the fast commutation behavior to using the slow commutation behavior. In this way, system 100 may help to prevent event 722 of FIG. 7. The delays 830, 840 can refer to PWM periods or edges of reference PWM signal 808 to obtain to a common reference for the first and second gate drivers.

Figure 9:
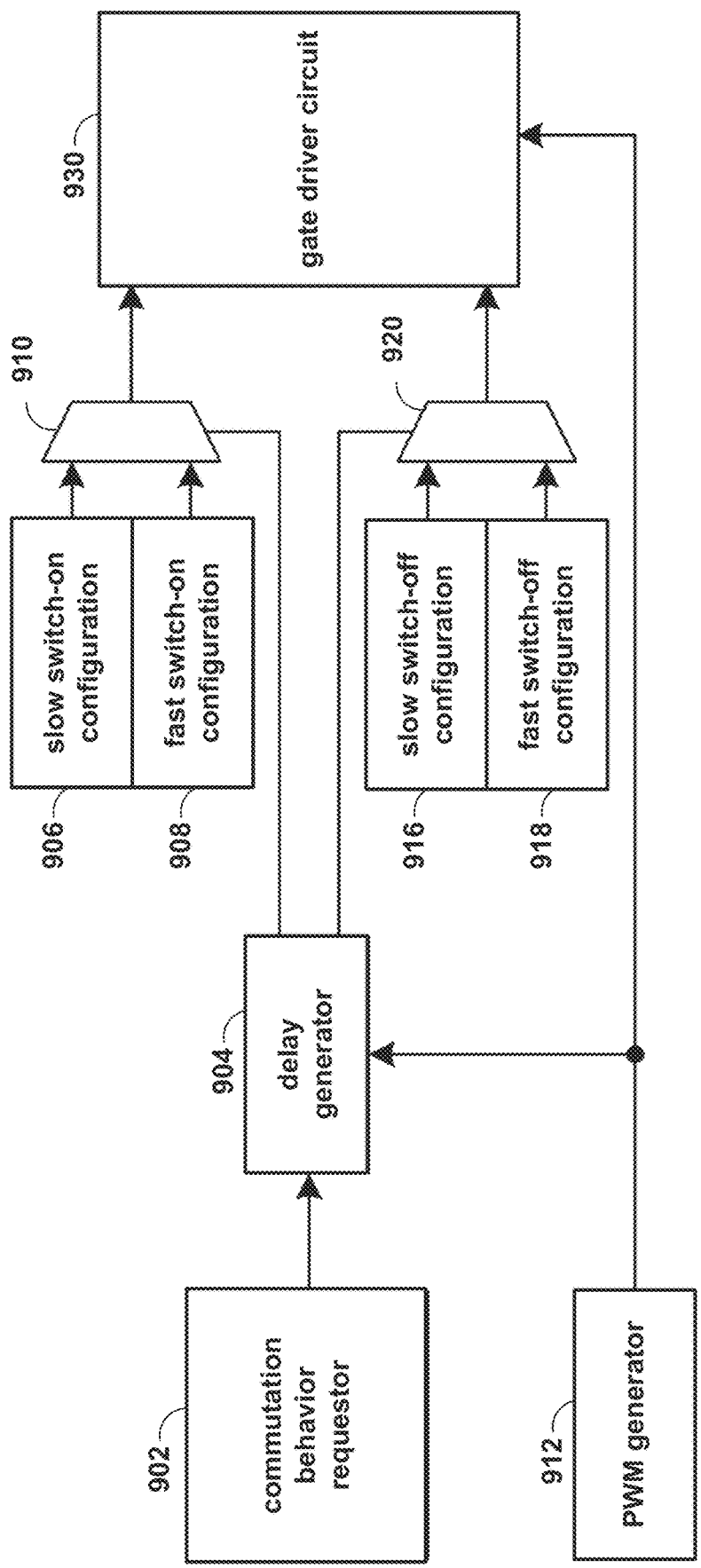
FIG. 9 is a conceptual diagram illustrating an example process of changing an activation setting and a deactivation setting of a switch at different times, in accordance with one or more techniques of this disclosure.

FIG. 9 is a conceptual diagram illustrating an example process of changing an activation setting and a deactivation setting of a switch at different times, in accordance with one or more techniques of this disclosure. FIG. 9 illustrates an example block diagram with the blocks for handling the timing of the updates. The gate driver circuit 930 can be configured for fast or slow switch-on and for fast or slow switch-off. Depending on the transition (from fast to slow or vice versa), the "risky" configuration is applied with a defined delay, e.g. synchronized to the PWM.

For a slow-to-fast transition example, delay generator 904 may receive a commutation behavior request indicating the slow-to-fast transition from commutation behavior requestor 902. In this example, delay generator 904 may cause mux 920 to immediately apply a fast switch-off configuration 918 to the next switch-off requested by the PWM signal output by PWM generator 912. Delay generator 904 may cause mux 910 to apply a fast switch-on configuration 908 to a later switch-on requested by the PWM signal output by PWM generator 912 only if the fast switch-off configuration 918 is ensured for the neighbor switch in the half-bridge (e.g., after a delay).

For a fast-to-slow transition example, delay generator 904 may receive a commutation behavior request indicating the fast-to-slow transition from commutation behavior requestor 902. In this example, delay generator 904 may cause mux 910 to immediately apply a slow switch-on configuration 906 to the next switch-on requested by the PWM signal output by PWM generator 912. Delay generator 904 may cause mux 920 to apply a slow switch-off configuration 916 to a later switch-off requested by the PWM signal output by PWM generator 912 only if the slow switch-on configuration 906 is ensured for the neighbor switch in the half-bridge (e.g., after a delay).

Figure 10:
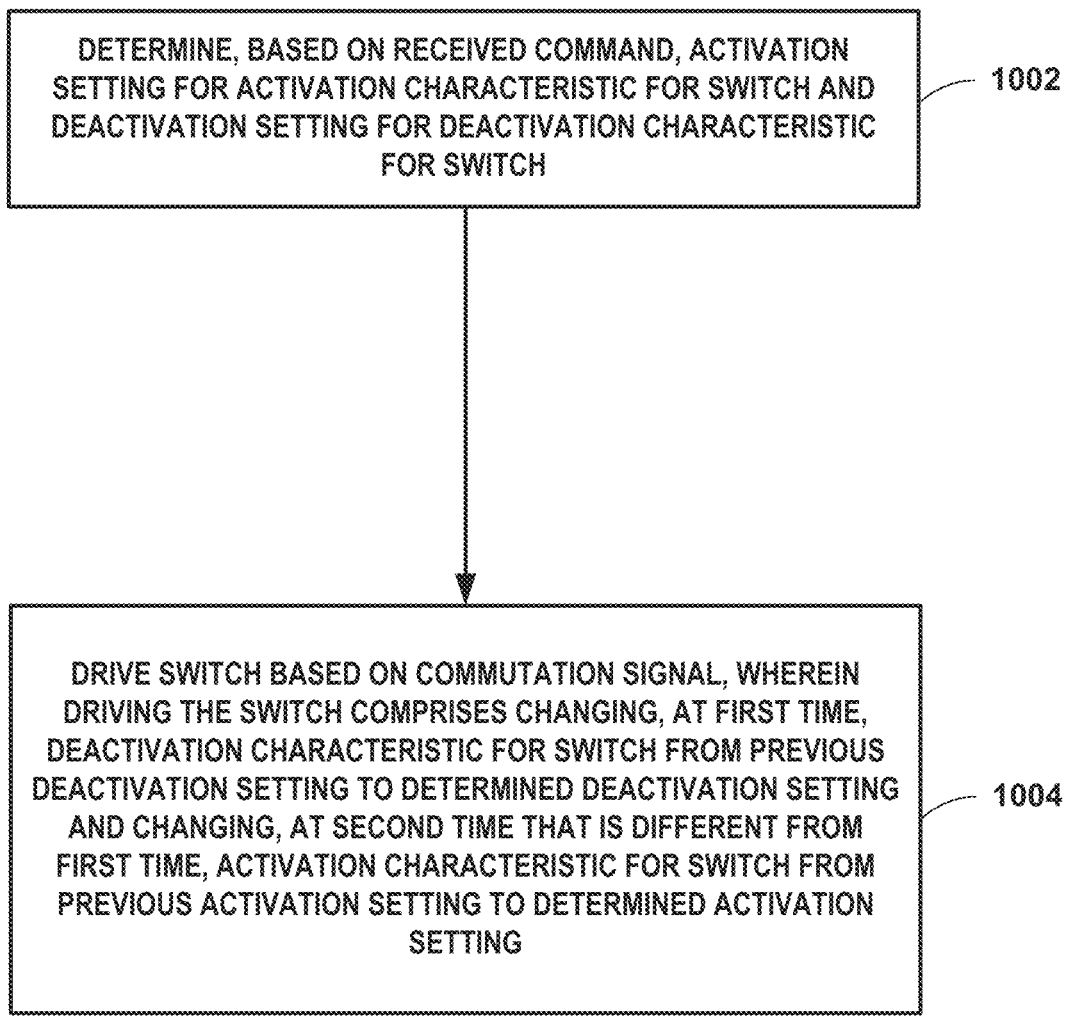
FIG. 10 is a block diagram illustrating an example method of driving a switch based on a commutation signal, in accordance with one or more techniques of this disclosure.

FIG. 10 is a block diagram illustrating an example method of driving a switch based on a commutation signal, in accordance with one or more techniques of this disclosure. FIG. 10 is discussed with reference to FIG. 1 for example purposes only. In the example of FIG. 10, first node 120 is configured to receive a command from controller circuitry. In this example, second node 122 is configured to receive a commutation signal for activating or deactivating a switch.

Processing circuitry 104 may determine, based on the received command, an activation setting for an activation characteristic for the switch and a deactivation setting for a deactivation characteristic for the switch (1002). Processing circuitry 104 may drive switch 130 based on the commutation signal, wherein driving switch 130 comprises changing, at a first time, the deactivation characteristic for switch 130 from a previous deactivation setting to the determined deactivation setting and changing, at a second time that is different from the first time, the activation characteristic for switch 130 from a previous activation setting to the determined activation setting (1004). In some examples, processing circuitry 104 may be configured to drive switch 103 based on an edge of the commutation signal.

For example, the determined activation setting may include a first rate of change. In this example, a previous activation setting may a second rate of change different from the first rate of change. To drive switch 130, processing circuitry 104 may be configured to select the first rate of change or the second rate of change based on the received command at first node 120 and to generate a gate voltage of switch 130 with the selected rate of change to activate switch 130.

Figure 11:
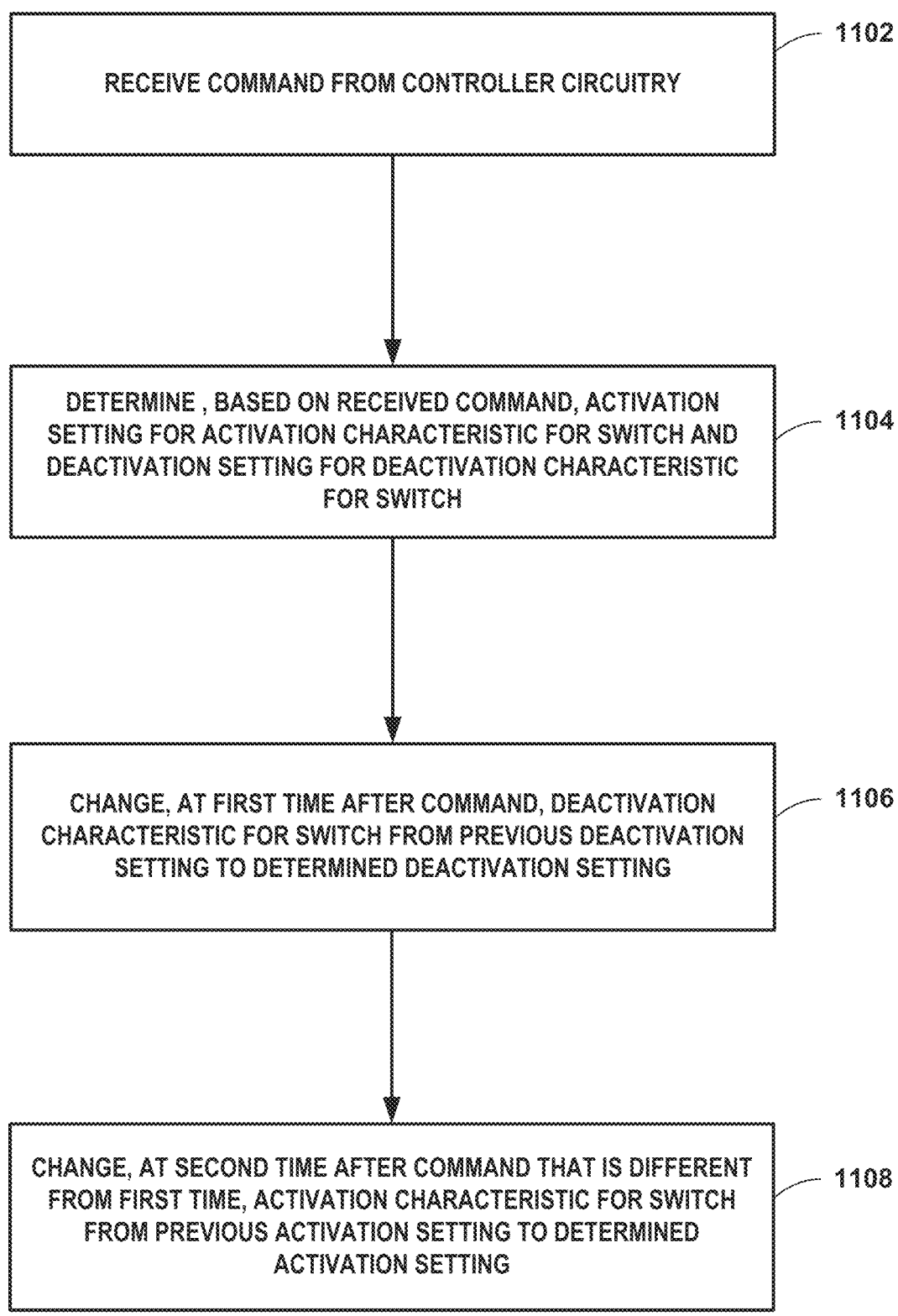
FIG. 11 is a block diagram illustrating an example method of determining an activation setting and a deactivation setting for a switch based on a commutation signal, in accordance with one or more techniques of this disclosure.

FIG. 11 is a block diagram illustrating an example method of determining an activation setting and a deactivation setting for a switch based on a commutation signal, in accordance with one or more techniques of this disclosure. FIG. 11 is discussed with reference to FIG. 1 for example purposes only.

Processing circuitry 104 may receive a command from controller circuitry 110 (1102). Processing circuitry 104 may determine, based on the received command, an activation setting for an activation characteristic for switch 130 and a deactivation setting for a deactivation characteristic for switch 130 (1104). Processing circuitry 104 may change, at a first time after the command, the deactivation characteristic for switch 130 from a previous deactivation setting to the determined deactivation setting (1106). Processing circuitry 104 may change, at a second time after the command that is different to the first time, the activation characteristic for switch 130 from a previous activation setting to the determined activation setting (1108).

Processing circuitry 104 may receive a commutation signal (e.g., at second node 122) for activating or deactivating switch 130. In this example, processing circuitry 104 may drive switch 130 to an activated state based on the commutation signal and the activation characteristic for switch 130 and to a deactivated state based on the commutation signal and the deactivation characteristic for switch 130. For example, processing circuitry 104 may drive, after the first time, switch 130 to the activated state after a first edge of the commutation signal using the determined activation setting. In this example, processing circuitry 104 may drive, after the second time, switch 130 to the deactivated state after a second edge of the commutation signal using the determined deactivation setting. The first edge may be different from the second edge.

The following clauses may illustrate one or more aspects of the disclosure.

Clause 1: A driver comprising: a first node configured to receive a command from controller circuitry; a second node configured to receive a commutation signal for activating or deactivating a switch; and processing circuitry configured to: determine, based on the received command, an activation setting for an activation characteristic for the switch and a deactivation setting for a deactivation characteristic for the switch: and drive the switch based on the commutation signal, wherein, to drive the switch, the processing circuitry is configured to change, at a first time, the deactivation characteristic for the switch from a previous deactivation setting to the determined deactivation setting and change, at a second time that is different from the first time, the activation characteristic for the switch from a previous activation setting to the determined activation setting.

Clause 2: The device of clause 1, wherein, to change the deactivation characteristic, the processing circuitry is configured to apply the determined deactivation setting to reduce an amount of time to deactivate the switch from an amount of time to deactivate the switch with the previous deactivation setting; and wherein, to change the activation characteristic, the processing circuitry is configured to apply the determined activation setting to reduce an amount of time to activate the switch from an amount of time to activate the switch with the previous deactivation setting after the processing circuitry has reduced the amount of time to deactivate the switch.

Clause 3: The device of clause 1, wherein, to change the deactivation characteristic, the processing circuitry is configured to apply the determined deactivation setting to increase an amount of time to deactivate the switch from an amount of time to deactivate the switch with the previous deactivation setting; and wherein, to change the activation characteristic, the processing circuitry is configured to apply the determined activation setting to increase an amount of time to activate the switch from an amount of time to activate the switch with the previous deactivation setting before the processing circuitry has increased the amount of time to deactivate the switch.

Clause 4: The device of clauses 1-3, wherein, to drive the switch based on the commutation signal, the processing circuitry is configured to drive the switch based on an edge of the commutation signal.

Clause 5: The device of clauses 1-4, wherein the commutation signal is a first commutation signal, the driver further comprising a third node to receive a second commutation signal different from the first commutation signal; wherein the activation characteristic comprises a minimum idle time window between an edge of the second commutation signal and an edge of the first commutation signal, and wherein the processing circuitry is configured to prevent an activation of the switch after the edge of the first commutation signal for at least the duration of the minimum idle time window starting after the edge of the second commutation signal.

Clause 6: The device of clauses 1-5, wherein the determined activation setting comprises a first rate of change, wherein the previous activation setting comprises a second rate of change different from the first rate of change, and wherein, to drive the switch, the processing circuitry is configured to select the first rate of change or the second rate of change based on the received command and to generate a gate voltage of the switch with the selected rate of change to activate the switch.

Clause 7: The device of clauses 1-6, wherein the received command is a first command and wherein the processing circuitry is configured to: for the first command, determine the second time to occur after the first time by at least a predetermined time duration; and for a second command, determine the first time to occur after the second time by at least the predetermined time duration.

Clause 8: The device of clauses 1-7, wherein the received command is a first command and wherein the processing circuitry is configured to: for the first command, determine the second time to occur after the first time by at least a set of edges of the commutation signal: and for a second command, determine the first time to occur after the second time by at least the set of edges of the commutation signal.

Clause 9: The device of clauses 1-8, wherein the controller circuitry is arranged on a first integrated circuit; wherein the driver is arranged on a second integrated circuit; and wherein the first integrated circuit is different from the second integrated circuit.

Clause 10: A system comprising: controller circuitry configured to output a command; commutation circuitry configured to generate a first commutation signal and a second commutation signal, a first driver configured to activate a first switch based on the first commutation signal and a first activation characteristic for the first switch and to deactivate the first switch based on the first commutation signal and a first deactivation characteristic for the first switch, wherein the first driver is configured to change, at a first time after the command, the first activation characteristic for the first switch from a first previous activation setting to a first following activation setting; and a second driver configured to activate a second switch based on the second commutation signal and a second activation characteristic for the second switch and to deactivate the second switch based on the second commutation signal and a second deactivation characteristic for the second switch, wherein the second driver is configured to change, at a second time after the command that is different to the first time, the second deactivation characteristic from a first previous deactivation setting to a second following deactivation setting.

Clause 11: The system of clause 10, wherein the first activation characteristic for the first switch influences a duration of a commutation of the first switch from a deactivated state to an activated state and the first deactivation characteristic for the first switch influences a duration of a commutation of the first switch from the activated state to the deactivated state; and wherein the second activation characteristic for the second switch influences a duration of a commutation of the second switch from the deactivated state to the activated state and the second deactivation characteristic for the second switch influences a duration of a commutation of the second switch from the activated state to the deactivated state.

Clause 12: The system of clauses 10-11, wherein the command is a first command and, for the first command, the first time is shorter than the second time; wherein the controller circuitry is configured to output a second command; wherein the first driver is configured to change, at a third time after the second command, the first activation characteristic for the first switch from a third previous activation setting to a third following activation setting: wherein the second driver is configured to change, at a fourth time after the second command that is different to the third time, the second activation characteristic from a fourth previous deactivation setting to a fourth following deactivation setting: and wherein the fourth time is shorter than the third time.

Clause 13: The system of clauses 10-12, wherein, to change the second deactivation characteristic for the second switch, the second driver is configured to apply the second following deactivation setting to reduce an amount of time to deactivate the second switch from an amount of time to deactivate the second switch with the second previous deactivation setting; and wherein, to change the first activation characteristic for the first switch, the first driver is configured to apply the first following activation setting to reduce an amount of time to activate the first switch from an amount of time to activate the first switch with the first previous activation setting after the second driver has reduced the amount of time to deactivate the second switch.

Clause 14: The system of clauses 10-13, wherein the first previous activation setting comprises a first rate of change and wherein the first following activation setting comprises a second rate of change different from the first rate of change; wherein, to activate the first switch, the first driver is configured to select the first rate of change or the second rate of change based on the command and to generate a gate voltage of the first switch with the selected rate of change to activate the first switch.

Clause 15: The system of clauses 10-14, wherein the second time is different from the first time by at least a predetermined time duration.

Clause 16: The system of clauses 10-15, wherein the second time is different from the first time by at least a set of edges of the first commutation signal.

Clause 17: The system of clauses 10-16, further comprising delay circuitry configured to: cause, based on the command, the first driver to change, at the first time, the first activation characteristic for the first switch from the first previous activation setting to the first following activation setting; and cause, based on the command, the second driver to change, at the second time, the second activation characteristic for the second switch from the second previous deactivation setting to the second following deactivation setting.

Clause 18: The system of clause 17, wherein the delay circuitry is further configured to: cause the first driver to change, at the first time, the first activation characteristic for the first switch from the first previous activation setting to the first following activation setting based further on the first commutation signal: and cause the second driver to change, at the second time, the second activation characteristic for the second switch from the second previous deactivation setting to the second following deactivation setting based further on the second commutation signal.

Clause 19: The system of clauses 17-18, wherein the delay circuitry is arranged in the controller circuitry.

Clause 20: The system of clauses 17-18, wherein the delay circuitry is arranged in the first driver and in the second driver.

Clause 21: A system comprising: controller circuitry configured to generate a first command and a second command; commutation circuitry configured to generate a first set of commutation signals and a second set of commutation signals; first phase circuitry comprising a first driver and a second driver configured to drive a first switch and a second switch based on the first set of commutation signals and the first command; and second phase circuitry comprising a third driver and a fourth driver configured to drive a third switch and a fourth switch based on a the second set of commutation signals and the second command.

Clause 22: The system of clause 21, further comprising: first current sensing circuitry configured to sense a first current flowing through the first phase circuitry and to deliver first information about the sensed first current to the controller circuitry; and wherein the controller circuitry is configured to output the first command depending on the first information about the sensed first current to the first phase circuitry.

Clause 23: The system of clause 22, further comprising: second current sensing circuitry configured to sense a second current flowing through the second phase circuitry and to deliver second information about the sensed second current to the controller circuitry; and wherein the controller circuitry is configured to output the second command depending on the second information about the sensed second current to the second phase circuitry.

Clause 24: A method for operating a driver, the method comprising: receiving, by processing circuitry, a command from controller circuitry; determining, by the processing circuitry, based on the received command, an activation setting for an activation characteristic for the switch and a deactivation setting for a deactivation characteristic for the switch; changing, by the processing circuitry, at a first time after the command, the deactivation characteristic for the switch from a previous deactivation setting to the determined deactivation setting; and changing, by the processing circuitry, at a second time after the command that is different to the first time, the activation characteristic for the switch from a previous activation setting to the determined activation setting.

Clause 25: The method of clause 24, further comprising: receiving, by the processing circuitry, a commutation signal for activating or deactivating a switch; and driving, by the processing circuitry, the switch to an activated state based on the commutation signal and the activation characteristic for the switch and to a deactivated state based on the commutation signal and the deactivation characteristic for the switch.

Clause 26: The method of clause 25, wherein driving the switch comprises driving, after the first time, the switch to the activated state after a first edge of the commutation signal using the determined activation setting and driving, after the second time, the switch to the deactivated state after a second edge of the commutation signal using the determined deactivation setting, wherein the first edge is different from the second edge.

Various aspects have been described in this disclosure. These and other aspects are within the scope of the following claims.

What is claimed is:

1. A driver comprising:
 a first node configured to receive a command from controller circuitry;
 a second node configured to receive a commutation signal for activating or deactivating a switch; and
 processing circuitry configured to:
  determine, based on the received command, an activation setting for an activation characteristic for the switch and a deactivation setting for a deactivation characteristic for the switch; and
  drive the switch based on the commutation signal, wherein, to drive the switch, the processing circuitry is configured to change, at a first time, the deactivation characteristic for the switch from a previous deactivation setting to the determined deactivation setting and change, at a second time that is different from the first time, the activation characteristic for the switch from a previous activation setting to the determined activation setting.

2. The driver of claim 1,
 wherein, to change the deactivation characteristic, the processing circuitry is configured to apply the determined deactivation setting to reduce an amount of time to deactivate the switch from an amount of time to deactivate the switch with the previous deactivation setting; and
 wherein, to change the activation characteristic, the processing circuitry is configured to apply the determined activation setting to reduce an amount of time to activate the switch from an amount of time to activate the switch with the previous deactivation setting after the processing circuitry has reduced the amount of time to deactivate the switch.

3. The driver of claim 1,
 wherein, to change the deactivation characteristic, the processing circuitry is configured to apply the determined deactivation setting to increase an amount of time to deactivate the switch from an amount of time to deactivate the switch with the previous deactivation setting; and
 wherein, to change the activation characteristic, the processing circuitry is configured to apply the determined activation setting to increase an amount of time to activate the switch from an amount of time to activate the switch with the previous deactivation setting before the processing circuitry has increased the amount of time to deactivate the switch.

4. The driver of claim 1, wherein, to drive the switch based on the commutation signal, the processing circuitry is configured to drive the switch based on an edge of the commutation signal.

5. The driver of claim 1, wherein the commutation signal is a first commutation signal, the driver further comprising a third node to receive a second commutation signal different from the first commutation signal;
 wherein the activation characteristic comprises a minimum idle time window between an edge of the second commutation signal and an edge of the first commutation signal, and
 wherein the processing circuitry is configured to prevent an activation of the switch after the edge of the first commutation signal for at least the duration of the minimum idle time window starting after the edge of the second commutation signal.

6. The driver of claim 1, wherein the determined activation setting comprises a first rate of change, wherein the previous activation setting comprises a second rate of change different from the first rate of change, and wherein, to drive the switch, the processing circuitry is configured to select the first rate of change or the second rate of change based on the received command and to generate a gate voltage of the switch with the selected rate of change to activate the switch.

7. The driver of claim 1, wherein the received command is a first command and wherein the processing circuitry is configured to:
 for the first command, determine the second time to occur after the first time by at least a predetermined time duration; and
 for a second command, determine the first time to occur after the second time by at least the predetermined time duration.

8. The driver of claim 1, wherein the received command is a first command and wherein the processing circuitry is configured to:
- for the first command, determine the second time to occur after the first time by at least a set of edges of the commutation signal; and
- for a second command, determine the first time to occur after the second time by at least the set of edges of the commutation signal.

9. The driver of claim 1,
- wherein the controller circuitry is arranged on a first integrated circuit;
- wherein the driver is arranged on a second integrated circuit; and
- wherein the first integrated circuit is different from the second integrated circuit.

\* \* \* \* \*